(12) United States Patent
    Landru et al.

(10) Patent No.: US 12,563,996 B2
(45) Date of Patent: Feb. 24, 2026

(54) HOLDING DEVICE FOR AN ASSEMBLY THAT IS TO BE FRACTURED

(71) Applicant: Soitec, Bernin (FR)

(72) Inventors: Didier Landru, Le Champ-près-Froges (FR); Oleg Kononchuk, Theys (FR); Nadia Ben Mohamed, Echirolles (FR)

(73) Assignee: Soitec, Bernin (FR)

( * ) Notice: Subject to any disclaimer, the term of this patent is extended or adjusted under 35 U.S.C. 154(b) by 615 days.

(21) Appl. No.: 17/438,866

(22) PCT Filed: Feb. 26, 2020

(86) PCT No.: PCT/FR2020/050371
    § 371 (c)(1),
    (2) Date: Sep. 13, 2021

(87) PCT Pub. No.: WO2020/188171
    PCT Pub. Date: Sep. 24, 2020

(65) Prior Publication Data
    US 2022/0059370 A1     Feb. 24, 2022

(30) Foreign Application Priority Data
    Mar. 15, 2019     (FR) ..................................... 1902681

(51) Int. Cl.
    *H01L 21/67*          (2006.01)
    *H10P 72/00*          (2026.01)
        (Continued)

(52) U.S. Cl.
    CPC ...... *H10P 72/0428* (2026.01); *H10P 72/0431* (2026.01); *H10P 72/7624* (2026.01); *H10P 90/1916* (2026.01); *H10W 10/181* (2026.01)

(58) Field of Classification Search
    CPC ......... H01L 21/76254; H01L 21/67098; H01L 21/67092; H01L 21/68785
    See application file for complete search history.

(56) References Cited

U.S. PATENT DOCUMENTS 6,427,748 B1    8/2002    Yanagita et al.
8,993,410 B2    3/2015    Henley et al.
            (Continued)

FOREIGN PATENT DOCUMENTS

EP          1385683          12/2006
EP          1423244          10/2007
            (Continued)

OTHER PUBLICATIONS

Japanese Office Action for Application No. 2021-555275 dated Feb. 6, 2024, 2 pages.
            (Continued)

*Primary Examiner* — Liang Dong
(74) *Attorney, Agent, or Firm* — TraskBritt

(57)          ABSTRACT

A holding device for a fracturable assembly, which is intended to separate along a fracture plane defined between an upper part and a lower part of the fracturable assembly, comprises at least two protrusions configured to keep the fracturable assembly suspended in a substantially horizontal holding position, the protrusions being intended to be located between the upper part and the lower part, against a peripheral chamfer of the upper part; a support located below and at a distance from the protrusions so as to gravitationally receive the lower part when the fracturable assembly is separated, and to keep it at a distance from the upper part held by the protrusions.

19 Claims, 2 Drawing Sheets

(51) Int. Cl.
  H10P 72/76   (2026.01)
  H10P 90/00   (2026.01)
  H10W 10/10   (2026.01)

(56)      References Cited

U.S. PATENT DOCUMENTS

|  |  |  |  |  |
|---|---|---|---|---|
| 9,640,711 | B2 | 5/2017 | Henley et al. | |
| 2002/0029849 | A1* | 3/2002 | Ohmi ................ | H01L 21/67092 |
| | | | | 156/708 |
| 2002/0157794 | A1* | 10/2002 | Yanagita .......... | H01L 21/67092 |
| | | | | 156/705 |
| 2012/0261076 | A1 | 10/2012 | Moriceau et al. | |
| 2013/0105538 | A1* | 5/2013 | Young .............. | H01L 21/67092 |
| | | | | 225/2 |
| 2013/0105539 | A1 | 5/2013 | Young et al. | |
| 2019/0035639 | A1* | 1/2019 | Wakabayashi .... | H01L 21/67115 |
| 2020/0108592 | A1* | 4/2020 | Tsao ................. | H01L 21/67092 |

FOREIGN PATENT DOCUMENTS

| | | | |
|---|---|---|---|
| EP | 1331663 | B1 | 11/2008 |
| EP | 1124674 | B1 | 12/2008 |
| FR | 2995441 | B1 | 11/2015 |
| FR | 3061988 | A1 | 7/2018 |
| JP | 2877800 | B2 | 3/1999 |
| JP | 3293736 | B2 | 6/2002 |
| JP | 2005-079389 | A | 3/2005 |
| JP | 2005-203595 | A | 7/2005 |
| JP | 2009-231533 | A | 10/2009 |
| JP | 2014-532992 | A | 12/2014 |
| JP | 6396853 | B2 | 9/2018 |
| KR | 10-2014-0110749 | A | 9/2014 |
| TW | 201643953 | A | 12/2016 |

OTHER PUBLICATIONS

Taiwanese Office Action and Search Report for Application No. 11220732150 dated Jul. 27, 2023, 25 pages with machine translation.

Singapore Written Opinion for Application No. 11202109690R dated Jun. 9, 2023, 21 pages.

International Search Report for International Application No. PCT/FR2020/050371 dated Jun. 2, 2020, 3 pages.

International Written Opinion for International Application No. PCT/FR2020/050371 dated Jun. 2, 2020, 6 pages.

Korean Office Action for Application No. 10-2021-7032945 dated May 28, 2024, 7 pages.

1 French Search Report for Application No. 1902681 dated Jan. 20, 2020, 2 pages.

Chinese First Notification of Office Action for Application No. 202080020794.1 dated Sep. 28, 2024, 11 pages.

* cited by examiner

HOLDING DEVICE FOR AN ASSEMBLY THAT IS TO BE FRACTURED

CROSS-REFERENCE TO RELATED APPLICATIONS

This application is a national phase entry under 35 U.S.C. § 371 of International Patent Application PCT/FR2020/050371, filed Feb. 26, 2020, designating the United States of America and published as International Patent Publication WO 2020/188171 A1 on Sep. 24, 2020, which claims the benefit under Article 8 of the Patent Cooperation Treaty to French Patent Application Serial No. 1902681, filed Mar. 15, 2019.

TECHNICAL FIELD

The present disclosure generally relates to the treatment of materials and, more specifically, of substrates for electronics, optics or optoelectronics. More specifically, the disclosure relates to a holding device for a fracturable assembly intended to separate along a fracture plane between an upper part and a lower part of the fracturable assembly.

BACKGROUND

A known method for manufacturing SOI "Silicon-on-Insulator" substrates, commonly known as the SMART CUT® method, mainly comprises the following steps:
- a step of ion implantation of light species, at a given depth in a donor substrate, in order to form a buried brittle plane comprising micro-cavities and delimiting a superficial layer intended to be transferred onto a support substrate; the donor substrate is, for example, made up of monocrystalline silicon;
- a step of assembling this donor substrate on a support substrate such as silicon, optionally surface oxidized, the assembly forming a fracturable assembly;
- a fracturing step for separating the fracturable assembly, along the buried brittle plane, into a first part comprising the support substrate and the transferred superficial layer (the SOI substrate) and into a second part comprising the remainder of the donor substrate.

During this last step, embrittlement heat treatment can promote the coalescence and the pressurization of the micro-cavities present in the buried brittle plane. Under the effect of this heat treatment alone, or by means of additional forces applied after the heat treatment, the initiation and the propagation of a fracture wave along the buried brittle plane allows the fracturable assembly to be separated into two parts.

This last step is conventionally implemented in annealing furnaces, the horizontal configuration of which is shown in FIG. 1. Such furnaces are designed to simultaneously treat a plurality of fracturable assemblies in a quartz tube 210.

FIG. 1 thus shows a plurality of fracturable assemblies 1 disposed on a receptacle or cradle 110, such as a quartz cradle, the fracturable assemblies being aligned parallel to each other. The cradle 110 for its part is placed on a movable scoop 120, allowing the fracturable assemblies 1 to be loaded into the tube 210 of the furnace 200 and to be unloaded at the end of the annealing process.

As can be seen in FIG. 1, the fracturable assemblies 1 are disposed vertically, i.e., the fracture plane for each of the fracturable assemblies 1 is vertical.

Due to the vertical arrangement of the fracturable assemblies 1, after fracturing, the two parts remain very close to each other in practice, and may even be pressed against each other. Each part then must be very carefully gripped, in order to ensure that the two parts are separated without damaging their surface finishes, by friction in particular. Several methods have been developed to implement this handling. Documents EP 1124674 or EP 1423244 particularly can be cited.

Document EP 1331663 presents an alternative to horizontal annealing furnaces. In this document, the fracturable assemblies are not disposed vertically, but horizontally. This document also describes the possibility of handling the fracturable assemblies before and after separation using a handling robot.

The Applicant has noted that when a fracturable assembly is positioned horizontally, sliding one part relative to the other during fracturing, and/or the step of gripping each part originating from the separation, could cause scratches on the facing faces of the two parts, due to a possible relative movement and friction of one part on the other. This is particularly true if the assembly rests on a rigid support. After separation, the substrate located at the top will approach the lower substrate under the effect of its own weight. The lower the distance separating the two substrates, the higher the probability of contact (and therefore of damage).

A cutting device and method are known from document EP 1385683 allowing the two parts originating from the fracturing of a fracturable assembly to be separated with high precision. Such a method involves placing the fracturable assembly horizontally on a fixed and flat chassis, with the chassis also supporting a wedge and a support for moving a fixed blade on this movement support. The lateral surface of the fracturable assembly is brought into abutment against the wedge, with the blade being intended to initiate, in the fracture plane, the separation of the fracturable assembly.

However, this document does not address the issue of the prospect of the parts originating from the fracturable assembly once the separation is complete. Indeed, for such a device, it can be difficult to keep each part at a distance from each other, in particular in order to be able to grip them, handle them and move them without risk of damage or contamination.

BRIEF SUMMARY

An object of this disclosure is to at least partly address the aforementioned disadvantages by proposing a device allowing minimal intervention for separating the two parts of a horizontal fracturable assembly after fracturing, and allowing the parts to be easily handled, thus limiting the risks of damage or of contamination.

With a view to achieving this aim, the subject matter of the disclosure describes a holding device for a fracturable assembly intended to separate along a fracture plane defined between an upper part and a lower part of the fracturable assembly, the holding device comprising:
- at least two protrusions configured to keep the fracturable assembly suspended in a substantially horizontal holding position, the protrusions being intended to be located between the upper part and the lower part against a peripheral chamfer of the upper part;
- a support, located below and at a distance from the protrusions, so as to gravitationally receive the lower part, when the fracturable assembly is separated, and to keep it at a distance from the upper part held by the protrusions.

Such a device allows the two parts of the fracturable assembly to be separated and to be kept at a distance from each other without recourse to any external handling, which handling is likely to damage or to contaminate either one of the parts. The separation is provided solely by the effect of gravity on the lower substrate.

Such a device also has the advantage of not exerting any contact with the facing faces of each of the parts of the fracturable assembly. A contact or a stress exerted on a face of the fracturable assembly is likely to degrade the quality of the fracture and, consequently, to reduce the uniformity of the transferred layers. Therefore, a device according to the disclosure has the advantage of providing substrates exhibiting significant surface homogeneity.

According to other advantageous and non-limiting features of the disclosure, considered alone or according to any technically feasible combination:

the distance between the support and the protrusions is between 1.5 and 10 mm, preferably between 2 and 5 mm;

the protrusions are disposed on columns;

at least one protrusion is disposed on a detachable column able to be moved in order to place the fracturable assembly in the holding position;

the holding device comprises at least three protrusions;

the holding device also comprises means for initiating a fracture wave for initiating, in the fracture plane, the separation of the fracturable assembly;

the initiation means comprise a blade;

the initiation means comprise an ultrasonic device able to emit an ultrasonic wave;

the support is intended to receive the lower part in the vicinity of a rear face of the lower part and comprises a recess to allow the lower part to be gripped by its rear face.

The subject matter of the disclosure also relates to a separation system for separating a fracturable assembly, the separation system comprising an enclosure and, disposed in the enclosure, a holding device as described above.

According to other advantageous and non-limiting features of the disclosure, considered alone or according to any technically feasible combination:

the enclosure is a chamber of a furnace for heat treating the fracturable assembly and for embrittling the fracture plane;

the furnace comprises means for heating by convection, by IR or microwave radiation, by induction;

the furnace is a single-wafer rapid annealing furnace.

BRIEF DESCRIPTION OF THE DRAWINGS

Further advantages and features of the disclosure will become apparent upon reading the detailed description of embodiments, which are by no means limiting, with reference to the accompanying drawings, in which.

DETAILED DESCRIPTION

Throughout the following description, detailed descriptions of known functions and elements, which could unnecessarily obscure the essence of this disclosure, will be omitted.

The figures are schematic representations that, for the sake of legibility, are not necessarily to scale. In particular, the thicknesses of the layers are not to scale relative to the lateral dimensions of these layers, nor relative to the dimensions of the elements forming a holding device according to the present disclosure.

The present disclosure relates to a holding device for a fracturable assembly 1. The structure of such a fracturable assembly 1 is schematically shown in FIG. 2.

Conventionally, a fracturable assembly 1 is implemented in the SMART CUT® method, as stated in the introduction.

In this method, a step of ion implantation of light species, such as, for example, hydrogen and/or helium ions, is performed in a donor substrate 2 in the vicinity of a main face 3. The donor substrate 2 can be made up of monocrystalline silicon or of any other material of interest.

Figure 1:
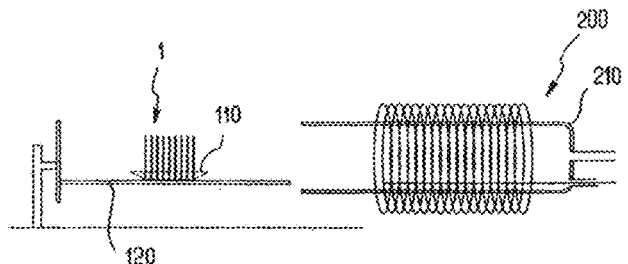
FIG. 1 depicts an annealing furnace of the prior art.
Figure 2:
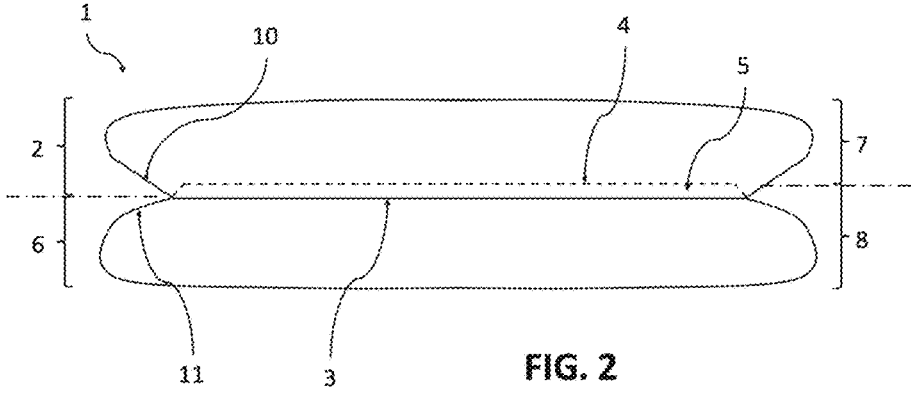
FIG. 2 depicts a cross-sectional view of a fracturable assembly.

In a manner known per se, and as shown in FIG. 2, the purpose of the implanted ions is to form a brittle buried zone 4, which hereafter will be referred to as the "fracture plane 4." This fracture plane 4 delimits, on the one hand, a thin layer 5 located on the side of the main face 3 and, on the other hand, the remainder of the donor substrate 2, which is referred to herein as the negative part.

In a step following assembly, which is also well known, the main face 3 of the donor substrate 2 is assembled with one face of a support substrate 6. The support substrate 6 can be made of any material of interest, for example, silicon, sapphire or glass.

The step of assembling the donor substrate 2 on the support substrate 6 can include direct bonding by molecular adhesion of the donor substrate 2 on the support substrate 6. An intermediate layer (not shown), for example, made of silicon oxide, can be formed prior to assembly, on one of the faces of one of the substrates 2, 6.

On completion of this assembly step, the fracturable assembly 1 is obtained, comprising the two associated substrates, with the face of the support substrate 6 adhering to the main face 3 of the donor substrate 2.

The fracturable assembly 1, when it is located in a horizontal position, has a fracture plane 4 that is defined between an upper part 7 and a lower part 8, the upper part 7 being located above the lower part 8.

In the example shown in FIG. 2, the upper part 7 comprises the negative part of the donor substrate 2. The lower part 8 for its part comprises the support substrate 6 and the thin layer 5 intended to be transferred. However, the disclosure is by no means limited to such a configuration, and it is entirely conceivable for the upper part 7 to comprise the assembly of the support substrate 6 and of the thin layer 5 and for the lower part 8 to comprise the negative part of the donor substrate 2.

The purpose of a SMART CUT®-type method is to transfer the thin layer 5 of the donor substrate 2 onto the support substrate 6. As previously stated, such a transfer is conventionally carried out following a heat treatment step for embrittling the fracture plane 4, then a step of initiating the separation, thermal or mechanical, in order to propagate a fracture wave and cause the separation between the two parts 7, 8 of the fracturable assembly 1. The term separation denotes, within the scope of the present application, the detachment of the fracturable assembly in the vicinity of the fracture plane, resulting in the formation of the two parts 7, 8.

Figure 3A:
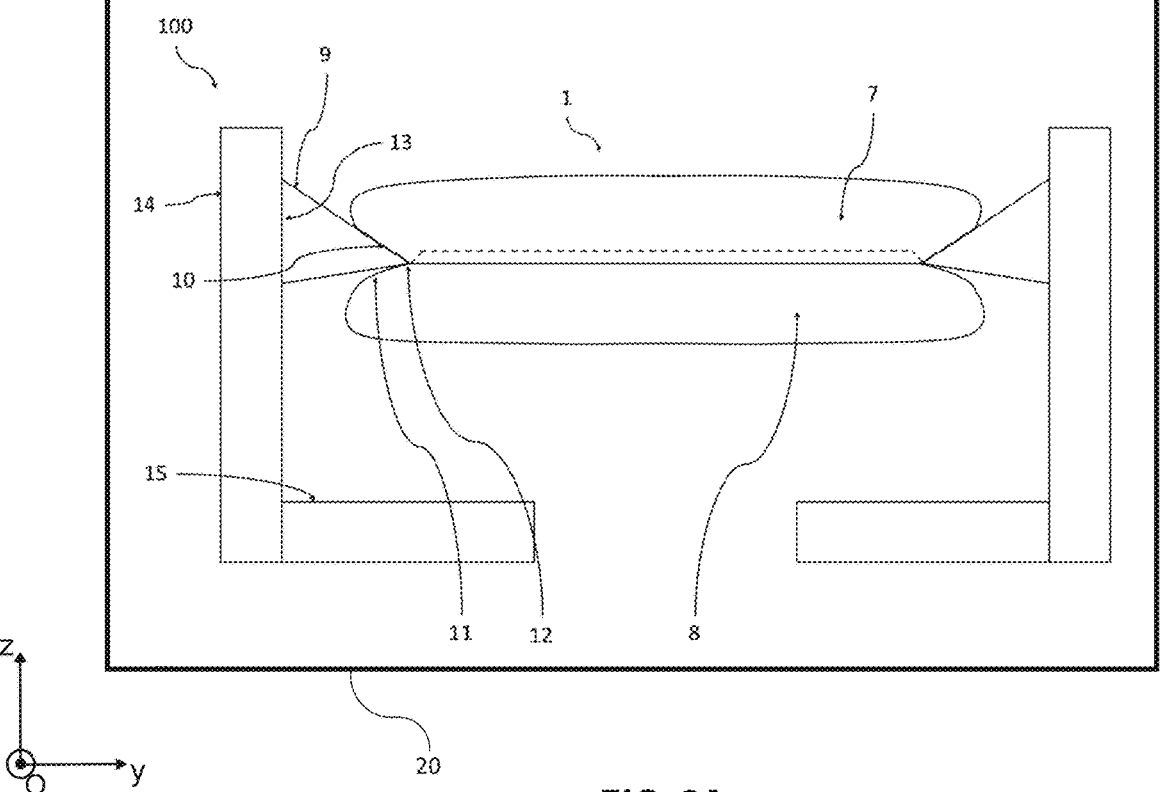
FIG. 3A depicts a side-sectional view of a holding device according to the disclosure before separation of the fracturable assembly.

FIG. 3A depicts a holding device 100 disposed in an enclosure 20 according to the present disclosure. An orthogonal Oxyz coordinate system is shown in FIG. 3A, such that the Oxy plane is horizontal. As a non-limiting example, the enclosure 20 may include a chamber of a furnace for heat treating fracturable assembly 1. In some embodiments, the enclosure 20 is a single-wafer rapid annealing furnace. In other embodiments, the enclosure 20 is a means for maintaining a controlled atmosphere. The holding device 100 comprises at least two protrusions 9 configured to keep the fracturable assembly 1 suspended in a substantially horizontal holding position.

In the present description, the term "suspended" means that the face of the lower part 8 opposite the fracture plane 4 is not in contact with any support, before separation, when the fracturable assembly 1 is in the holding position.

The term "substantially horizontal" means that the fracturable assembly 1 is in a horizontal position, i.e., parallel to the Oxy plane, with an incline relative to a horizontal plane that is less than or equal to plus or minus 10°, and preferably less than or equal to plus or minus 50°.

FIG. 3A shows the fracturable assembly 1 when it is in the holding position, before separation. In such a holding position, the protrusions 9 are located between the upper part 7 and the lower part 8 of the fracturable assembly 1, against a peripheral chamfer 10 (also shown in FIG. 2) of the upper part 7.

Conventionally, with the substrates being circular with a diameter of 200 mm or 300 mm, for example, the peripheral chamfer 10 of the upper part 7, and a chamfer 11 of the lower part 8, if it exists, form a circular groove on the periphery of the fracturable assembly 1.

Each protrusion 9 has an end 12 configured to be inserted into the groove. The end 12 must be thin enough to be able to be introduced deep enough into the groove so as to reliably hold the fracturable assembly 1 in the holding position.

Advantageously, the protrusion 9 is bevel shaped, the thickness of which in the direction (Oz) decreases in the direction (Oy) of a base 13, up to the end 12.

Typically, the depth of a groove in the direction (Oy) is approximately 250 µm, whereas the gap in the direction (Oz) between the upper part 7 and the lower part 8 in the vicinity of the perimeter of the groove is approximately 300 µm. In order to provide reliable holding of the fracturable assembly 1 in the holding position, the thickness of the end 12 is then preferably less than 1 mm, for example, 200 µm. The angle formed by the bevel can be approximately 20°.

Figure 3B:
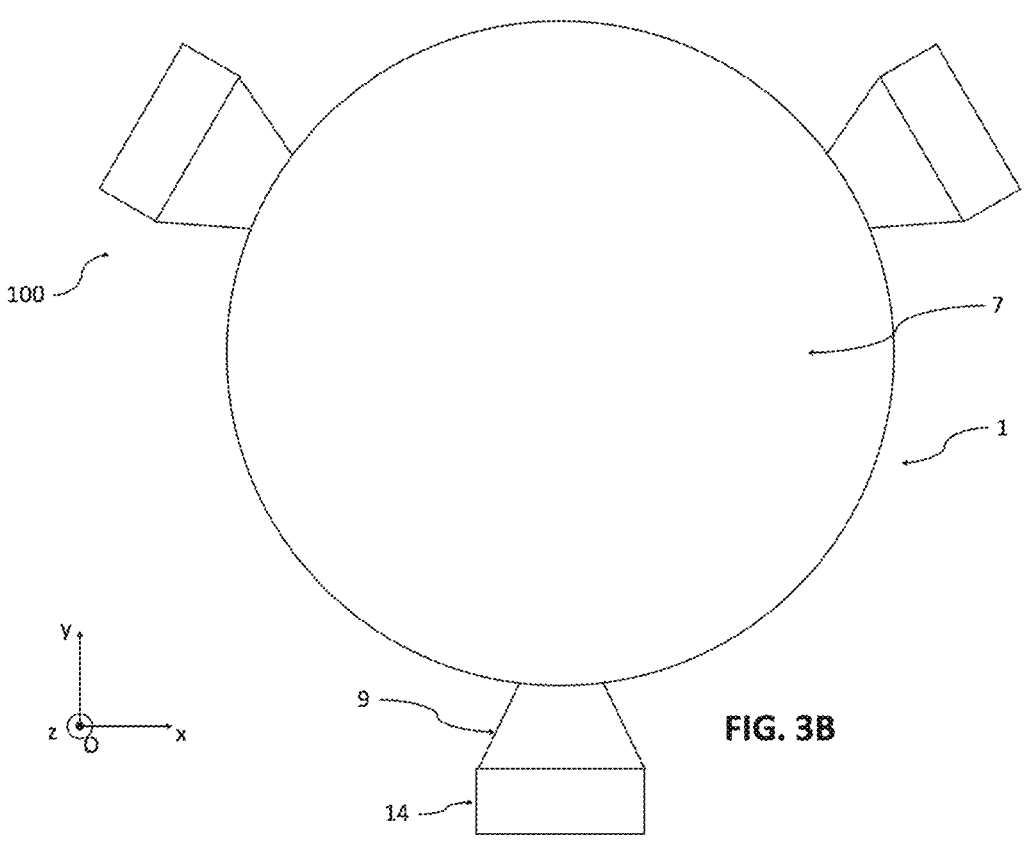
FIG. 3B depicts a top view of a holding device according to the disclosure.

In order to be optimally inserted into the groove, the end 12 can assume a shape in the Oxy plane that complements that of the groove. For example, if the groove is circular, the end 12 can have a concave circular geometry, the curvature radius of which is similar to that of the groove (FIG. 3B).

Of course, the disclosure is by no means limited to the previously described shapes of substrates and of protrusions. For example, it is possible for the substrates, and therefore the groove, to have a polygonal shape, for example, rectangular, in which case, the end 12 can have a straight geometry in the Oxy plane. It is also possible for the protrusion 9 to have a consistent thickness in the direction (Oz), preferably of less than 1 mm, for example, equal to 200 µm.

The protrusions 9 are disposed, in the vicinity of their base 13, on support elements 14 that allow them to be held at a determined height and in an angular position on the periphery of the fracturable assembly 1. Advantageously, the support elements 14 can be columns. Such a configuration facilitates the handling of the fracturable assembly 1 (before separation) and of the two parts 7, 8 (after separation) between the protrusions 9, compared to the hypothesis whereby the protrusions 9 would be disposed on walls surrounding the device, in particular for the use of articulated arms.

Regardless of the nature of the support elements 14 on which the protrusions 9 are disposed, the support elements 14 and the protrusions 9 are made from a material having a cleanliness level that is compatible with the requirements that are conventionally required in separation methods, such as the SMART CUT® method, in order to avoid any contamination. For example, these materials can be selected from quartz, silicon carbide, silicon or certain polymers, such as KAPTON®.

In a particularly advantageous manner, at least one protrusion 9 is movable, so that it can be cleared when the fracturable assembly is installed. To this end, this protrusion 9 can be secured to a detachable column. When installing the fracturable assembly 1 on the holding device 100, the fracturable assembly 1 is positioned in order to engage the peripheral groove in the other protrusions 9, for example, by means of an articulated arm, in order to place the peripheral chamfer 10 on the protrusions 9. Subsequently, the detachable column can be moved until the movable protrusion 9 is brought into abutment against the peripheral chamfer 10, and is then set in this position, placing the fracturable assembly 1 in the holding position.

According to a first alternative embodiment, the dimension of the end 12 of a protrusion 9 in the Oxy plane can be a fraction of the perimeter of the peripheral chamfer 10.

For example, the dimension of the end 12 can be approximately a quarter, a third, or even half, the perimeter of the peripheral chamfer 10. In general, in this first alternative embodiment, two protrusions 9 will be sufficient for holding the fracturable assembly 1 in its holding position, in particular when they are disposed facing one another.

According to a second particularly advantageous alternative embodiment, the dimension of the end 12 of a protrusion 9 in the Oxy plane is negligible opposite the perimeter of the peripheral chamfer 10.

The term "negligible" means, in the present description, that the dimension of the end 12 is less than a quarter of the perimeter of the peripheral chamfer 10, even less than a tenth of the perimeter of the peripheral chamfer 10.

Typically, the dimension of the end 12 in the Oxy plane can be 10 mm.

Such a configuration allows the protrusions 9 to be disposed on narrow columns (support elements 14), in order to reduce their spatial requirement and facilitate handling operations.

In this alternative embodiment shown in FIG. 3B, the holding device 100 comprises at least three protrusions 9. This allows the fracturable assembly 1 to remain stable in its holding position despite the small size of the protrusions 9. For example, the holding device 100 can comprise three, four, five, even six protrusions 9 for holding the fracturable assembly 1.

In the situations whereby the holding device 100 comprises more than four protrusions 9, it is desirable for at least two protrusions 9 to be movable, disposed on detachable columns, in order to facilitate the handling and the positioning of the fracturable assembly 1 in the holding position.

Preferably, in order to provide better stability, the protrusions 9 are evenly angularly positioned around the fracturable assembly 1. For example, when the peripheral chamfer 10 is circular, the protrusions 9 are evenly distributed around the fracturable assembly 1, as shown in FIG. 3B. However, the disclosure is by no means limited to such a distribution.

Figure 3C:
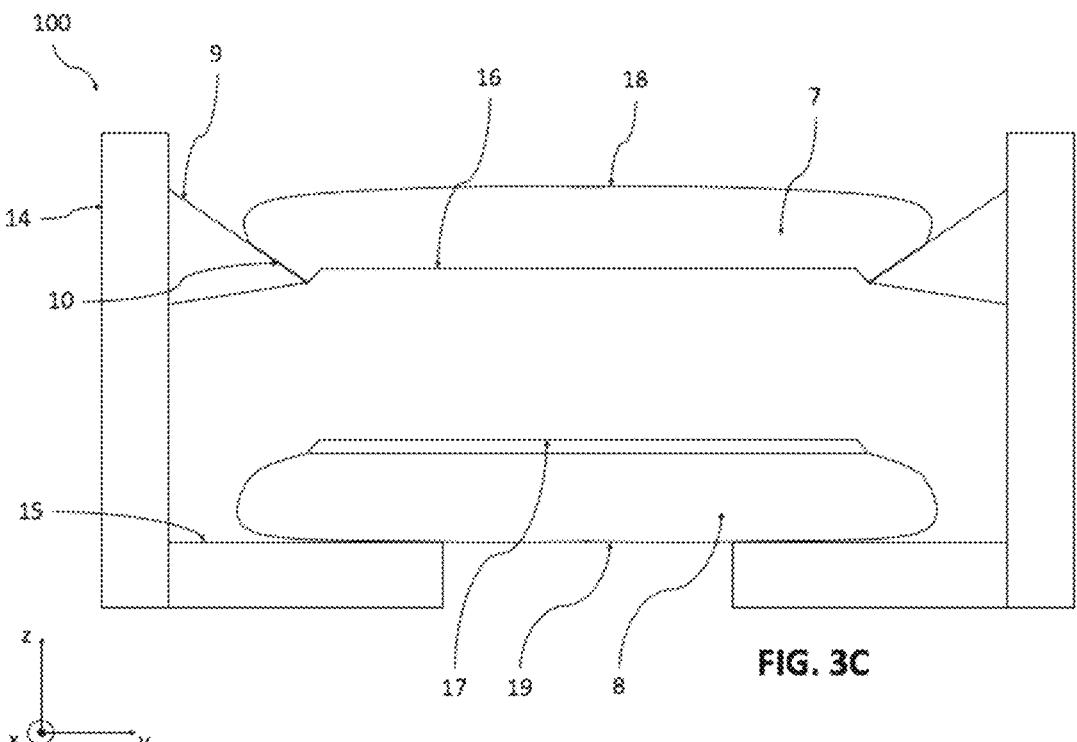
FIG. 3C depicts a side-sectional view of a holding device according to the disclosure after separation of the fracturable assembly.

As already stated, the fracturable assembly 1 is intended to separate along the fracture plane 4 in order to form the upper part 7 and the lower part 8. An illustration of a holding device 100 after separation of the fracturable assembly 1 is shown in FIG. 3C. The upper part 7 comprises a front face 16 originating from the separation in the vicinity of the fracture plane 4 of the fracturable assembly 1, facing a front face 17 of the lower part 8. The upper part 7 also comprises a rear face 18 opposite its front face 16. The lower part 8 similarly comprises a rear face 19 opposite its front face 17.

The holding device 100 according to the present disclosure comprises a support 15 located below and at a distance from the protrusions 9.

The term "below" means, within the scope of the present description, that when the support 15 is used with the fracturable assembly 1 it is positioned relative to the protrusions 9 in order to gravitationally receive the lower part 8, when the fracturable assembly 1 is separated. In other words, when the fracturable assembly 1 separates, the upper part 7 and the lower part 8 separate in the vicinity of the fracture plane 4: the upper part 7 remains held by the protrusions 9, whereas the lower part 8 is driven by gravity until its rear face 19 is in contact with the support 15.

The term "at a distance" means that the distance between the support 15 and the protrusions 9 is strictly greater than the thickness of the lower part 8, so that, in the holding position, the fracturable assembly 1 is not in contact with the support 15. The contact zone between the fracturable assembly 1 and the holding device 100 is thus limited to the protrusions 9. Holding the fracturable assembly 1 with the protrusions 9 alone allows the stresses applied thereto to be minimized. Minimizing the contact surface between the fracturable assembly 1 and the holding device 100 allows, during fracturing, each part 7, 8 of the fracturable assembly 1 to be free to deform. With any contact with the rear face 19 of the lower part 8 forming an impression on its front face 17 at the time of the fracture, minimizing these contacts promotes homogeneous propagation of the fracture wave.

The term "at a distance" also means that when the fracturable assembly 1 is separated, the distance between the support 15 and the protrusions 9 is sufficient to allow the lower part 8 to effectively separate from the upper part 7 held by the protrusions 9, and to keep the two parts at a distance from each other, i.e., without any contact between their front faces 16, 17.

Advantageously, the distance between the support 15 and the protrusions 9 is sufficient to allow either one of the parts 7, 8 to be handled and extracted without any risk of making contact between them.

By way of an example, the distance between the protrusions 9 and the support 15 is selected so as to be between 1.5 and 10 mm, even between 2 mm and 5 mm, for a lower part 8 with a thickness in the direction (Oz) that is between 500 microns and 800 microns.

The support 15 can be a single piece and connected to at least part of the support elements 14. For example, it can be a plate integrally designed with the support elements 14, for example, circular and preferably made up of the same materials as them.

According to a particularly advantageous configuration, the support 15 comprises a recess to allow the lower part 8 to be gripped by its rear face 19, for example, by the articulated arm of an automated robot. Such a configuration avoids any intervention in the zone located between the two front faces 16, 17, which is likely to damage or contaminate either one of the parts 7, 8.

Alternatively, the holding device 100 can comprise a plurality of supports 15, each support being independently connected to a support element 14, in such a way that the faces of the plurality of supports 15 facing the protrusions 9 are parallel and at the same height, so as to hold the lower part 8 in a substantially horizontal position after separation. For example, if the support elements 14 comprise columns, a support 15 can be a base of the support element 14, extending in the same direction as the protrusion 9, below the protrusion. In this particular embodiment, the lower part 8 is driven by gravity until its rear face 19 makes contact with the plurality of supports 15.

The shape of the support 15 is irrelevant, for example, rectangular. Preferably, its shape is adapted to be as compact as possible and so as not to hinder the handling of the lower part 8.

Similarly, the dimensions of the support 15 are irrelevant and can be selected as a function of the dimensions of the fracturable assembly 1 so as to limit the spatial requirement, allow the lower part 8 to be gripped by its rear face 19, and to be strong enough to support the support elements 14 and the fracturable assembly 1.

In any case, in order to allow comfortable handling, the distance between the two parts 7, 8 originating from the fracturable assembly 1 after separation is preferably greater than 1 mm.

However, this distance must not be excessive so as not to risk damage of the lower part 8 at the end of its fall when it makes contact with the support 15.

The Applicant has particularly noted that a maximum distance of approximately 5 mm existed, which, particularly advantageously, should not be exceeded in order to benefit from a physical effect allowing the speed of the lower part 8 to be decreased as it falls following the separation of the fracturable assembly 1.

On separation of the two parts 7, 8 in the vicinity of the fracture plane 4, the lower part 8 is drawn towards the support 15 under the effect of gravity. The pressure in the space located between the rear face 19 of the lower part 8 and the support 15 is then close to the atmospheric pressure, lower than the pressure in the space located between the two parts 7, 8 due to the pressure of the gaseous species in the cavities forming the fracture plane 4. This pressure difference also promotes the separation of the two parts 7, 8.

However, the sudden separation of the two parts 7, 8 leads to under pressure in the space located between parts 7, 8, which, under pressure, slows down the fall of the lower part 8, with the pressure above the lower part 8 being less than the pressure below.

The close spacing separating the two parts 7, 8, combined with the viscosity of the air, limits the circulation of air between these two parts 7, 8 and the rebalancing of the pressures, which helps to slow down the fall of the lower part 8 until it makes contact with the support 15. This thus reduces the risks of damaging the rear face 19 of the lower part 8.

Consequently, the distance between the two front faces 16, 17, when the rear face 19 of the lower part 8 is in contact with the support 15, is preferably between 1 and 5 mm, in order to preserve the aforementioned effects that promote controlled landing of the lower part 8 on the support 15.

In the case whereby the lower part 8 is an SOI substrate, it is typically approximately 700 to 800 micrometers thick, for a diameter of 200 or 300 mm.

Advantageously, and in a by no means limiting manner, a holding device 100 according to the present disclosure can be used within the context of a separation system for separating the fracturable assembly 1.

The holding device 100 can be disposed in the enclosure 20 (FIG. 3A) including, for example, the chamber of a furnace able to heat treat the fracturable assembly 1, within a temperature range of 100° C. to 500° C., for example.

The means for heating the furnace can be means for heating by convection, by infrared or microwave radiation, or by induction.

Such heat treatment, which is well known per se, allows the fracture plane 4 to be embrittled by promoting the coalescence and the pressurization of the micro-cavities contained in the fracture plane 4.

Preferably, the holding device 100 is disposed in a single-wafer rapid annealing furnace, in order to be able to bring the fracturable assembly 1 to the embrittlement and/or fracturing temperature within a very short time period, typically a few seconds to a few minutes. Such speed allows rapid separation of a fracturable assembly 1, enabling significant throughput for the separation system.

Assuming that the holding device 100 is included in the separation system and that the holding device 100 is likely to be placed in a furnace, the material forming the support elements 14 and the protrusions 9 must, in addition to complying with the conditions related to the contamination of the upper 7 and lower 8 parts of the fracturable assembly 1, have heat resistance properties in line with the aforementioned temperatures. In particular, from the aforementioned list, the materials forming the support elements 14 and the protrusions 9 are then preferably selected from quartz, silicon carbide, silicon or KAPTON®.

Alternatively, a holding device 100 according to the disclosure can be disposed not in the furnace, but at the exit of the furnace, in order to collect the fracturable assembly 1 once an embrittlement step is carried out and before the fracture occurs.

A holding device 100 according to the disclosure also can be completely separate from a furnace, the embrittlement of the fracturable assembly 1 then being carried out upstream, independently of the holding device 100.

Advantageously, the enclosure 20 in which a holding device 100 according to the disclosure can be placed can comprise means for maintaining a controlled atmosphere, and preferably a non-oxidizing atmosphere, for at least some of the treatment. The Applicant has noted that such a non-oxidizing atmosphere would allow, when it was temperature applied at least from the moment of detachment of the two parts, the two front faces 16, 17 to be smoothed at a lower temperature than in the case of an atmosphere containing a notable amount of oxygen.

The term "non-oxidizing" is typically understood to be an atmosphere having an oxygen content, which can be contained in dioxygen or in water in particular, that is less than 10 ppm. The controlled atmosphere thus can be a neutral or reducing atmosphere. The non-oxidizing atmosphere inside the enclosure can be obtained by means for circulating a continuous gaseous flow of inert gas (such as argon or helium) or of reducing gas (such as hydrogen).

The effects of such a step of smoothing in a non-oxidizing atmosphere have been described in greater detail in document FR 3061988.

According to an alternative embodiment of the disclosure, the holding device 100 can comprise means for initiating a fracture wave in the fracture plane 4 of the fracturable assembly 1.

According to a first option, the initiation means are formed by a mechanical opening element, comprising, for example, a blade. The blade can be disposed on one of the detachable columns, supplementing or replacing one of the protrusions 9. With the movement of the support element 14, the blade can be inserted between the two parts 7, 8, thus exerting a mechanical stress that is able to initiate the propagation of the fracture wave along the fracture plane 4. Alternatively, the blade can be fixed to an articulated arm, the movement of which can be controlled independently of the support elements 14 supporting the protrusions 9.

The blade is made of a smooth material that is hard enough to penetrate the fracturable assembly 1, but that is not too hard so as to avoid any risk of damaging the front faces 16, 17 of the parts 7, 8. By way of an example, the blade can be produced from a material such as polyvinyl chloride (PVC) or polyetheretherketone (PEEK).

According to a second option, the initiation means comprise an ultrasonic device able to emit an ultrasonic wave. The ultrasonic wave, directed toward the fracture plane 4, propagates inside micro-cavities of the embrittled fracture plane 4, allowing initiation of the propagation of the fracture wave.

Of course, other options for the initiation means can be contemplated.

The mechanical initiation of the fracture wave, according to any one of the aforementioned options, can be carried out inside or outside the furnace.

Following the initiation, the fracture wave self-propagates in the fracture plane 4, resulting in the separation of the fracturable assembly 1 into two parts 7, 8, as previously described and shown in FIG. 3C.

Of course, the disclosure is not limited to the described embodiments and alternative embodiments can be added without departing from the scope of the invention as defined by the claims.

Thus, even though the separation system has been described allowing a fracturable assembly to be separated at atmospheric pressure, it is possible to provide means for controlling the pressure of the atmosphere prevailing around the parts 7, 8 during the treatment or from the moment of separation, when this occurs in an enclosure.

Thus, a reduction in the pressure of the enclosure leads to a reduction in the pressure difference that exists in the instants following the moment of the detachment between the space located between the two parts 7, 8 and the remainder of the volume of the enclosure. The phenomenon of slowing down the fall of the lower part 8 is then minimized. Such control can be interesting in that it allows the separation of the lower 8 and upper 7 parts from each other to be accelerated. Conversely, the separation speed can be reduced through a controlled increase in the pressure prevailing in the enclosure.

The invention claimed is:

1. A holding device for a fracturable assembly intended to separate along a fracture plane defined between an upper part and a lower part of the fracturable assembly, the holding device comprising:

at least two columns;

at least one protrusion attached to each of the at least two columns, the protrusions configured to keep the fracturable assembly suspended in a substantially horizontal holding position, the protrusions being configured to be located between the upper part and the lower part, against a peripheral chamfer of the upper part; and at least one support, the at least two columns attached to the at least one support, the at least one support located below and at a first distance from the protrusions and below and configured to be at a second distance from the lower part of the fracturable assembly with the second distance being less than the first distance, the second distance being configured such that the lower part of the fracturable assembly falls the second distance due to gravity when the fracturable assembly is separated and comes to rest on the at least one support, and a lower surface of the lower part is maintained at the first distance from the upper part, the upper part remaining held in suspension by the protrusions the first distance above the at least one support.

2. The holding device of claim 1, wherein the distance between the at least one support and the at least one protrusion is between 1.5 and 10 mm.

3. The holding device of claim 1, wherein at least one protrusion of the protrusions is disposed on a column able to be moved to place the fracturable assembly in the substantially horizontal holding position.

4. The holding device of claim 1, wherein the protrusions include at least three protrusions.

5. The holding device of claim 1, further comprising an initiation device configured to initiate a fracture wave for initiating, in the fracture plane, separation of the fracturable assembly.

6. The holding device of claim 5, wherein the initiation device comprises a blade.

7. The holding device of claim 5, wherein the initiation device comprises an ultrasonic device able to emit an ultrasonic wave.

8. The holding device of claim 1, wherein the at least one support is intended to receive the lower part in a vicinity of a rear face of the lower part and comprises a recess to allow the lower part to be gripped by the rear face.

9. A separation system for separating a fracturable assembly, the separation system comprising an enclosure and, disposed in the enclosure, the holding device according to claim 1.

10. The separation system of claim 9, further comprising a furnace, and wherein the enclosure includes a chamber of the furnace for heat treating the fracturable assembly and for embrittling the fracture plane.

11. The separation system of claim 10, wherein the furnace comprises at least one heating device for heating by convection, by IR or microwave radiation, or by induction.

12. The separation system of claim 11, wherein the furnace comprises a single-wafer rapid annealing furnace.

13. The holding device of claim 12, wherein at least one protrusion of the protrusions is disposed on a column able to be moved to place the fracturable assembly in the substantially horizontal holding position.

14. The holding device of claim 13, wherein the protrusions include at least three protrusions.

15. The holding device of claim 14, further comprising an initiation device configured to initiate a fracture wave for initiating, in the fracture plane, separation of the fracturable assembly.

16. The holding device of claim 15, wherein the initiation device comprises a blade.

17. The holding device of claim 15, wherein the initiation device comprises an ultrasonic device able to emit an ultrasonic wave.

18. The holding device of claim 15, wherein the at least one support is intended to receive the lower part in a vicinity of a rear face of the lower part and comprises a recess to allow the lower part to be gripped by the rear face.

19. The holding device of claim 1, wherein an upper portion of the protrusions is attached to each of the at least two columns, the upper portion configured to extend above the upper part of the fracturable assembly.

* * * * *